(12) United States Patent
Van Lanen et al.

(10) Patent No.: US 11,977,139 B2
(45) Date of Patent: May 7, 2024

(54) ACCELERATED COOLDOWN OF LOW-CRYOGEN MAGNETIC RESONANCE IMAGING (MRI) MAGNETS

(71) Applicant: KONINKLIJKE PHILIPS N.V., Eindhoven (NL)

(72) Inventors: Ezra Petrus Antonius Van Lanen, Niskayna, NY (US); Matthew Jonathan Voss, Clifont Park, NY (US); Philippe Abel Menteur, Niskayna, NY (US)

(73) Assignee: Koninklijke Philips N.V., Eindhoven (NL)

( * ) Notice: Subject to any disclaimer, the term of this patent is extended or adjusted under 35 U.S.C. 154(b) by 217 days.

(21) Appl. No.: 17/610,453

(22) PCT Filed: May 15, 2020

(86) PCT No.: PCT/EP2020/063684
§ 371 (c)(1),
(2) Date: Nov. 11, 2021

(87) PCT Pub. No.: WO2020/234178
PCT Pub. Date: Nov. 26, 2020

(65) Prior Publication Data
US 2022/0236349 A1    Jul. 28, 2022

Related U.S. Application Data

(60) Provisional application No. 62/850,748, filed on May 21, 2019.

(51) Int. Cl.
*G01R 33/38* (2006.01)
*G01R 33/3815* (2006.01)
(Continued)

(52) U.S. Cl.
CPC ..... *G01R 33/3804* (2013.01); *G01R 33/3815* (2013.01); *H01F 6/04* (2013.01); *H01F 6/06* (2013.01)

(58) Field of Classification Search
CPC ... G01R 33/3804; G01R 33/3815; H01F 6/04; H01F 6/06
See application file for complete search history.

(56) References Cited

U.S. PATENT DOCUMENTS 3,662,566 A    5/1972    Brand
5,187,938 A    2/1993    Mraz et al.
(Continued)

FOREIGN PATENT DOCUMENTS

CN    106158228 A    11/2016
JP    624309 A    1/1987
(Continued)

OTHER PUBLICATIONS

International Search Report and Written Opinion From PCT/EP2020/063684 dated Nov. 26, 2020.

*Primary Examiner* — G. M. A Hyder

(57) ABSTRACT

An apparatus (200) includes: a cryostat (214) containing a volume of cryogenic fluid; one or more superconducting coils (202) within the cryostat; a sealed cooling system (204) within the cryostat and configured to maintain the one or more superconducting coils n a persistent state; and a second cooling system (210) having a first portion in contact with the sealed cooling system within the cryostat, a second portion extending outside of the cryostat.

17 Claims, 6 Drawing Sheets

(51) Int. Cl.
*H01F 6/04* (2006.01)
*H01F 6/06* (2006.01)

(56) References Cited

U.S. PATENT DOCUMENTS

| | | |
|---|---|---|
| 2009/0275478 A1 | 11/2009 | Atkins et al. |
| 2011/0219785 A1 | 9/2011 | Black et al. |
| 2012/0196753 A1 | 8/2012 | Laskaris et al. |
| 2014/0159726 A1 | 6/2014 | Ackermann et al. |
| 2018/0120392 A1* | 5/2018 | Laskaris ............ G01R 33/3804 |

FOREIGN PATENT DOCUMENTS

| | | |
|---|---|---|
| JP | 0869911 A | 3/1996 |
| WO | 2015011679 A1 | 1/2015 |

* cited by examiner

ACCELERATED COOLDOWN OF LOW-CRYOGEN MAGNETIC RESONANCE IMAGING (MRI) MAGNETS

CROSS REFERENCE TO RELATED APPLICATIONS

This application is a U.S. national phase application of International Application No. PCT/EP2020/063684 filed on May 15, 2020 which claims the benefit of US Provisional Application Serial No. 62/850,748 filed on May 21, 2019 and is incorporated herein by reference.

FIELD

The following relates generally to superconducting persistent magnets, and in particular, to a system and method for accelerating the cooldown time of magnetic resonance imaging (MRI) magnets that have a sealed cryostat, and related arts.

BACKGROUND

High field MRI magnets contain coils made of superconducting wire, which are required to maintain a cryogenic temperature to be operational. This temperature is usually maintained by a cryogenic cooler (e.g., a coldhead), which maintains the temperature of a large helium inventory. Maintaining this helium inventory at cryogenic temperature (e.g., around 4K or lower) over the extended deployment period of an MRI scanner can have a high financial burden for hospital sites around the world, which is a leading factor for development cryogen-free magnets (sealed magnets). In general, these cryogen-free magnets contain a fraction of the original helium volume of a conventional system and such systems may be hermetically sealed, taking away the need to maintain the magnet with additional supplies of helium.

The following discloses certain improvements to overcome these problems and others.

SUMMARY

In one aspect, an apparatus includes: a cryostat containing a volume of cryogenic fluid; one or more superconducting coils within the cryostat; a sealed cooling system within the cryostat and configured to maintain the one or more superconducting coils in a persistent state; and a second cooling system having a first portion in contact with the sealed cooling system within the cryostat, a second portion extending outside of the cryostat.

In another aspect, a superconducting magnet includes: a vacuum vessel; one or more superconducting coils disposed within the vacuum vessel; a hermetically sealed cooling system disposed within the vacuum vessel and containing helium, the superconducting coils being in thermal contact with the hermetically sealed cooling system; and a cooldown acceleration loop comprising one or more fluid conduits disposed within the vacuum vessel and in thermal contact with hermetically sealed cooling system and further comprising inlet and outlet ports at an exterior of the vacuum vessel.

In another aspect, a cooldown method for cooling down a superconducting magnet comprising magnet windings disposed in a vacuum vessel, a hermetically sealed cooling system disposed in the vacuum vessel in thermal communication with the magnet windings, and a cooldown acceleration loop in thermal communication with the hermetically sealed cooling system, includes: evacuating the vacuum vessel; flowing a cryogenic fluid through the cooldown acceleration loop via inlet and outlet ports of the cooldown acceleration loop; and concurrently with the flowing of the cryogenic fluid, cooling the hermetically sealed cooling system.

One disclosed aspect relates to accelerating the cool down time of magnetic resonance imaging (MRI) magnets that have a hermetically sealed cryostat. Tubing hardware is provided that runs along the magnet's internal cooling system, but it allows the flow of a cryogen from an external reservoir. Cooling down the magnet to its operating temperature can be done much faster this way than with a cold head alone, which reduces the overall manufacturing time, as well as the time to make the MRI system operational.

Like conventional magnets, sealed magnets need to be cooled down from room temperature to its cryogenic operating temperature after manufacturing, or after installation at a hospital site. Conventionally, the coldhead operates to take out the thermal energy, which can lead to considerable delay in overall magnet production time, and installation time.

Superconducting magnets disclosed herein employ a cryostat that contains tubing that runs along the main sealed cooling circuitry, but has openings at both ends to the outside world. In normal operation, these openings are closed, but when cooling down, they are connected to an external supply, that runs the cooling agent through the tube to accelerate the magnet's cool down time. The cryogen used for this process can be captured, and after completing cool down, the tube's ends are closed.

In one embodiment, the cooling system and the superconducting coils inside the MRI magnet are suspended through low-thermal conductivity straps in a high vacuum to minimize the amount of conductive and convective heat reaching the coils. Getter material, such as charcoal or any other suitable getter material, may be used to achieve this level of vacuum. As soon as the temperature drops below a certain value, it becomes active and traps the gas molecules that reach it. By mounting this getter material on the fast cooldown loop, this temperature can be reached sooner, which further helps accelerating the overall cool down time. This also allows a magnet with poor vacuum to have its vacuum recovered using cryogen instead of a vacuum pump.

One advantage resides in reducing a delay in production time of a magnet of an MRI system.

Another advantage resides in reducing the installation time of a magnet of an MRI system, and/or reducing startup time of the magnet after servicing of the MRI.

Another advantage resides in providing a magnet of an MRI system designed as disclosed herein to reduce the amount of time for cooldown of the magnet.

Another advantage resides in reducing thermal load on a coldhead of an MRI system during cooldown of the magnet.

A given embodiment may provide none, one, two, more, or all of the foregoing advantages, and/or may provide other advantages as will become apparent to one of ordinary skill in the art upon reading and understanding the present disclosure.

BRIEF DESCRIPTION OF THE DRAWINGS

The disclosure may take form in various components and arrangements of components, and in various steps and arrangements of steps. The drawings are only for purposes of illustrating the preferred embodiments and are not to be construed as limiting the disclosure.

DETAILED DESCRIPTION

Figure 1:
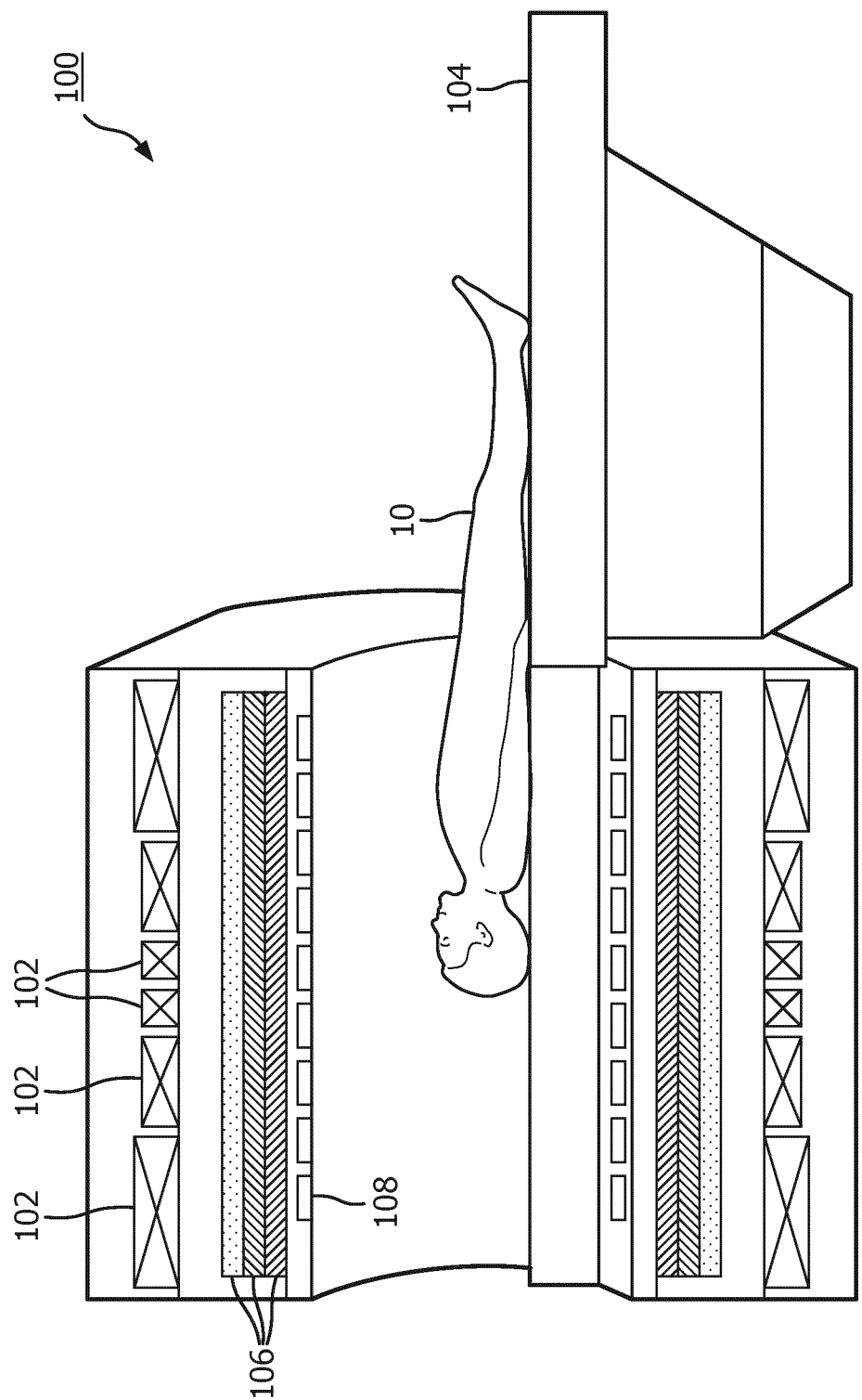
FIG. 1 diagrammatically illustrates an exemplary embodiment of a magnetic resonance imaging (MRI) apparatus.

Conventional MRI magnets use a vacuum jacketed liquid helium vessel, in which the superconducting windings are immersed in the liquid helium. A cold head runs to keep the liquid helium at a cryogenic temperature effective to keep the superconducting windings in the superconducting state. Usually, the cryogenic temperature for superconductivity is around or below 4K. This design requires a large quantity of helium which can be lost to evaporation over time, and places a large load on the cold head.

In some newer generation designs (so-called "sealed magnet" design), the magnet windings are disposed in a vacuum vessel and are in thermal contact with a hermetically sealed cooling circuit containing a much smaller volume of helium (e.g. six liters when liquefied). A cold head cools the closed (i.e. sealed) cooling circuit. The approach greatly reduces or eliminates helium loss, and the magnet can be warmed up and then cooled down without incurring the cost of replacement helium.

One downside of this newer generation design is increased cooldown time. The cooling circuit at room temperature contains gas helium at high pressure (e.g. 1000 psi) in order to accommodate the pressure decrease as the fixed quantity of helium in the sealed cooling circuit cools. This gas helium must be cooled down to below 4K or even lower (e.g. 3K) to achieve superconductivity of the superconducting windings, which takes a long time. (By contrast, liquid helium is loaded directly into a conventional magnet helium vessel, which provides much faster cooldown albeit at the cost of a much larger helium inventory).

In embodiments disclosed herein, a sealed magnet is modified in that a fast cooldown loop (also referred to herein as a cooldown acceleration loop) is provided that is in thermal contact with (e.g. soldered to) the sealed cooling circuit. In a modified cooldown sequence, upon startup of the cold head a chilled or cryogenic fluid is flowed through the cooldown acceleration loop so as to achieve more rapid cooldown. The ultimate (low) temperature achieved using the cooldown acceleration loop is determined by the choice of chilled or cryogenic fluid (for example, if liquid nitrogen at 77K is used then the ultimate achievable temperature is some value greater than 77K); after this point the cold head provides further cooldown. The cooldown acceleration loop is then evacuated (by actively applying a vacuum pump and/or by cryo-pumping provided as the sealed cooling circuit continues to cool down by action of the cold head) and sealed off so that it does not interfere with the final cooldown provided by the cold head.

The following discloses various embodiments which differ in aspects such as the choice/sequence of chilled and/or cryogenic fluid(s) employed. In one embodiment, a single step of chilled gas helium (e.g. at 80K) is employed. In this case, when the magnet reaches around 80K the connection of the cooldown acceleration loop is switched over to a vacuum pump and evacuated and then sealed off. In a variant approach more than one step of chilled gas helium may be employed, e.g. after pumping out the 80K gas helium the loop may be switched over to a 20K gas helium supply to further chill to around 20K before final evacuation/sealing of the cooldown acceleration loop.

In other embodiments, liquid nitrogen (LN) is used as the cryogenic fluid. This can achieve a temperature of around 100K (the LN will still be boiling into gas phase in the fast cooling loop). Other gases are contemplated as the cryogenic fluid, e.g. argon gas, but the low cost of nitrogen coupled with its low boiling point of 77K makes it economically attractive as the cryogenic fluid for chilling to around 80K or higher.

In yet other embodiments, the final stage (after one or more gas He or LN stages) is a liquid helium (LHe) stage. As with LN, the LHe will likely be boiled off in the fast cooling loop, so the ultimate temperature achieved by the loop here is likely to be around 10K.

When using LN, it is likely to be sufficient to switch off the flow of LN and allow the nitrogen in the cooldown acceleration loop to mostly boil off. Any remaining gas nitrogen will ultimately freeze out onto the inner wall of the loop when the cold head cools the mass down to below around 77K (freezing point of nitrogen at 1 atm). In effect, the cooldown acceleration loop is evacuated of working nitrogen fluid automatically by cryo-pumping driven by (further) cooldown of the sealed cooling circuit via the cold head.

On the other hand, the helium will not liquefy until very near the end of the cooling phase (if even then). Gas helium nearing 10K or so under these conditions can exhibit thermoacoustic oscillations, which can complicate the cooldown by the cold head. To avoid this, the cooldown sequences employing helium working fluid include an active evacuation stage in which a mechanical pump is applied to actively evacuate the gas He working fluid from the cooldown acceleration loop during switchover to cold head-only cooling.

In some embodiments disclosed herein, getter material is disposed on portions of the external surface of the cooldown acceleration loop (that is, the surface exposed to the vacuum volume). Sealed magnets, while not consuming helium beyond the initial charge loaded into the sealed cooling circuit, do include a containing vacuum vessel in order to maintain a vacuum of around $10^{-6}$ Torr or lower at room temperature. (The sealed cooling circuit and thermally connected superconducting windings will operate as a cryopump at magnet operating temperature so as to achieve pressures possibly as low as $10^{-8}$ Torr or lower during operation). An advantage of sealed magnets is that they facilitate performing servicing, including warmup and subsequent cooldown of the magnet, onsite and possibly performed by hospital personnel. However, hospital personnel are often reluctant to deploy a mechanical pump in an MRI laboratory or other clinical setting due to concerns such as pump oil leakage, pump exhaust gases/particulates, or other environmental contamination. Hence, providing for more robust vacuum in the magnet cryostat by way of getter material disposed on the cooldown acceleration loop can facilitate on-site maintenance without the need for mechanical pumping of the vacuum volume.

The getter material, which can be carbon, activated carbon, or the like, is disposed inside the vacuum volume, and preferably on the external surface of the cooldown acceleration loop. For maximum effectiveness, this getter material should be cooled, and is of most importance early in the cooldown cycle when the vacuum vessel will be at highest pressure. In some embodiments, some or all of the getter material is disposed on the inlet pipe of the cooldown acceleration loop, which will be chilled fastest. In a variant embodiment, thermally conducting fins, panels, or the like may be attached to the cooldown acceleration loop, and even more preferably on the inlet pipe of the cooldown acceleration loop, to increase the surface area for the getter material.

One disclosed aspect relates to flow passages (e.g., tubing, also referred to herein as the fast cooling loop) that run along the main sealed cooling circuitry, but has openings at both ends to the outside world. In normal operation, these openings are closed, but when cooling down, they are connected to an external supply, that runs the cooling agent through the tube to accelerate the magnet's cool down time. All the cryogen used for this process can be captured, and after completing cool down, the tube's ends are closed.

FIG. 1 illustrates one exemplary embodiment of a magnetic resonance imaging (MRI) apparatus 100. MRI apparatus 100 can include, for example, a magnet 102 a patient table 104 configured to hold a patient 10; gradient coils 106 configured to at least partially surround at least a portion of patient 10 for which MRI apparatus 100 generates an image; a radio frequency coil 108 configured to apply a radio frequency signal to at least the portion of patient 10 which is being imaged, and to alter the alignment of this magnetic field; and a scanner configured to detect changes in the magnetic field caused by the radio frequency signal. The general operation of an MRI apparatus is well known and therefore will not be repeated here.

Figure 2:
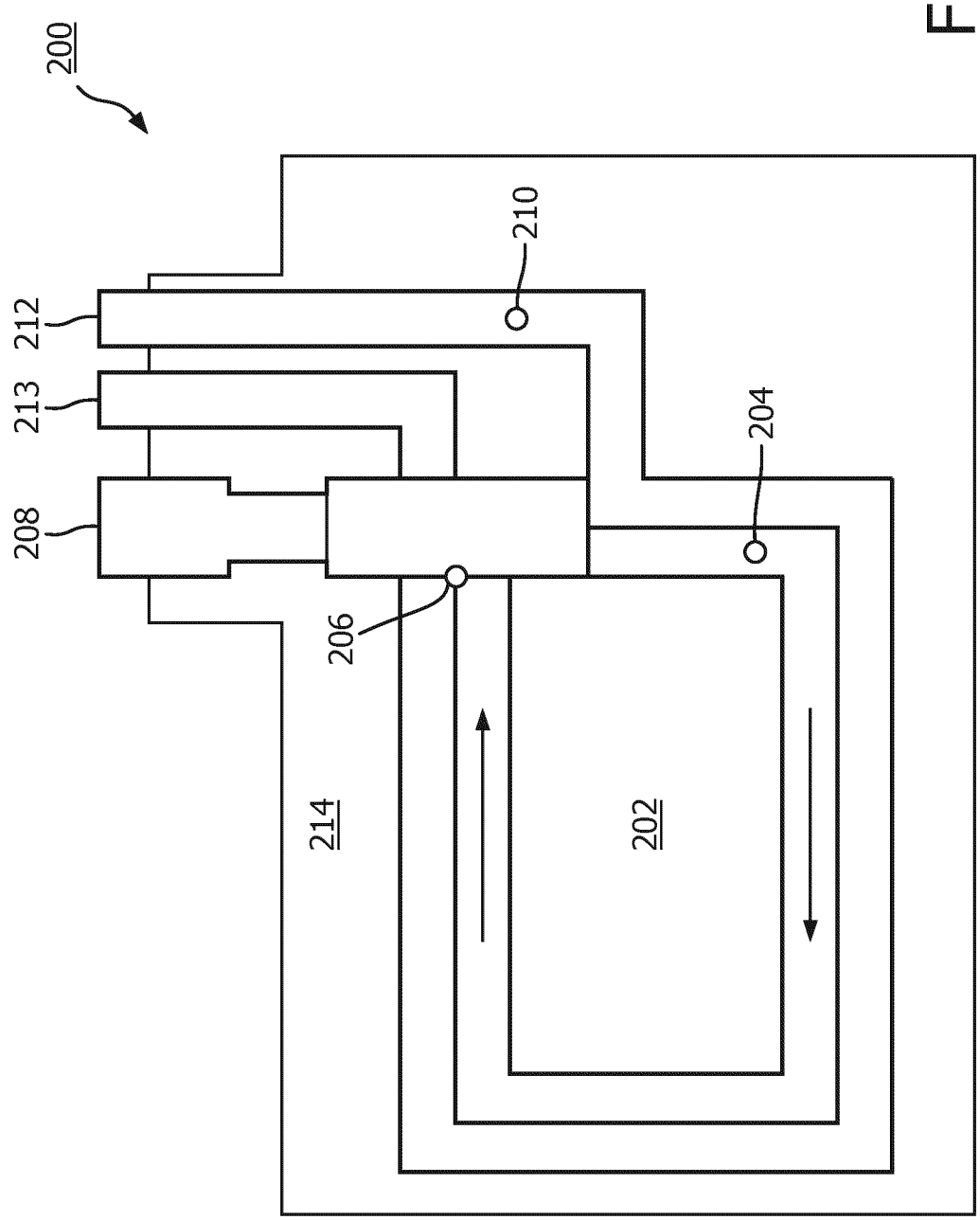
FIG. 2 illustrates an exemplary embodiment of a superconducting magnet system which may be employed in an MRI apparatus in accordance with aspects of the present invention.

Referring to FIG. 2, an exemplary system (i.e. sealed superconducting magnet) 200 in accordance with certain disclosed aspects is illustrated. The system 200 includes a superconducting coil 202, a sealed cooling system 204 that runs along one or more cooling panels of the superconducting coil, and the mounting boards of other components to a heat exchanger 206 that is connected to a coldhead 208. U.S. Patent No. 2014/0159726 is incorporated herein by reference and illustrates an exemplary cooling system that runs along one or more cooling panels of the superconducting coils.

The sealed cooling system 204 has a set amount of cooling agent, such as helium. At operating temperature, this agent circulates through the system due to gravity induced convection. As disclosed herein, an additional set of high thermally conducting tubes form a fast cooldown loop 210 (also referred to herein as a cooldown acceleration loop 210 or a second cooling system) that make intimate contact with the main cooling tubes of the cooling system 204 via a solid-solid heat exchanger 206. The cooldown acceleration loop 210 has at least one port 212, and more preferably two ports 212, 213 that extend outside a cryostat 214. The cryostat 214 defines a vacuum volume 214. The conducting tubes of the cooldown loop 210 itself can contain a gas or liquid at atmospheric pressure while the cryostat 214 remains at vacuum.

Figure 3:
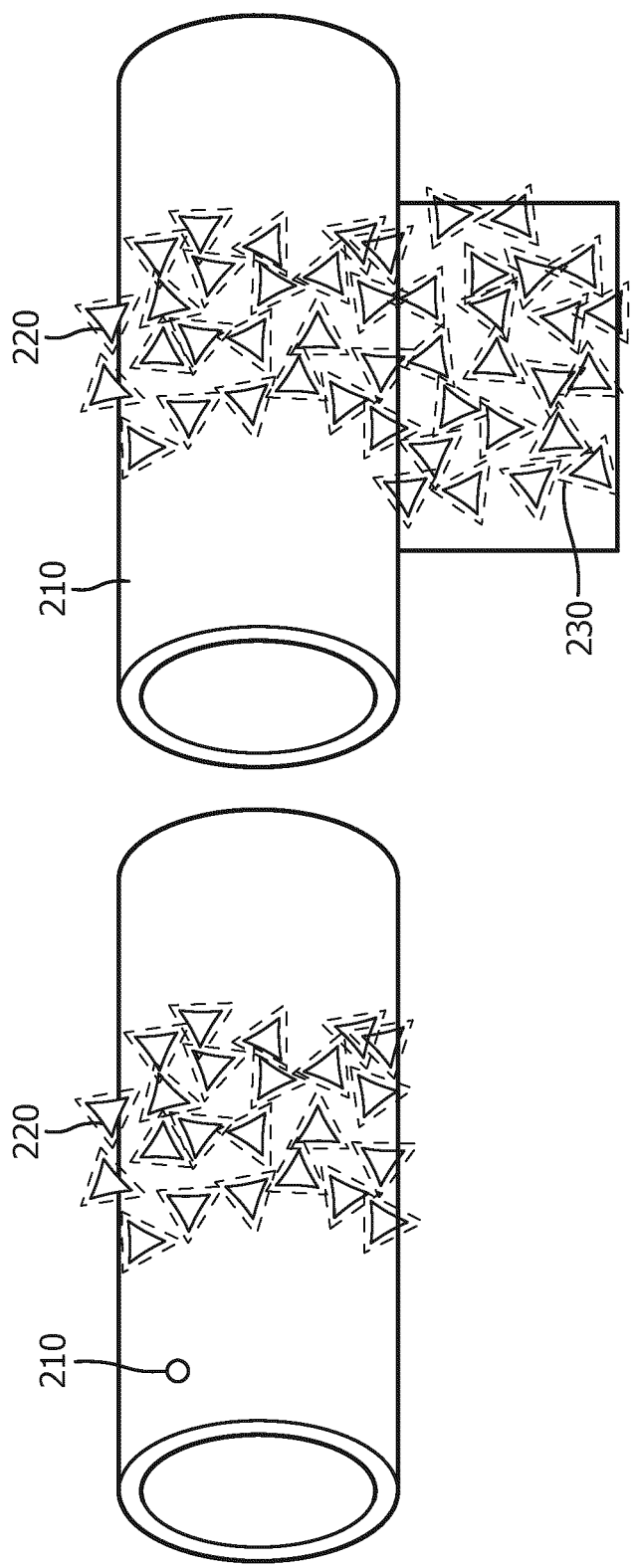
FIG. 3 illustrates an exemplary embodiment of tubes suitable for use in accordance with the present invention.

Referring to FIG. 3, getter material 220, such as charcoal or any other suitable material, is optionally mounted on the outer walls of the tubes of the cooldown acceleration loop 210, on the vacuum side (e.g., the portion of the cooldown acceleration loop inside the cryostat 214). The total surface area for the getter material can also optionally be increased by connecting high thermally conductive panels 230 on the cooldown acceleration loop 210, and mounting the getter material 220 on these panels 230.

Figure 4:
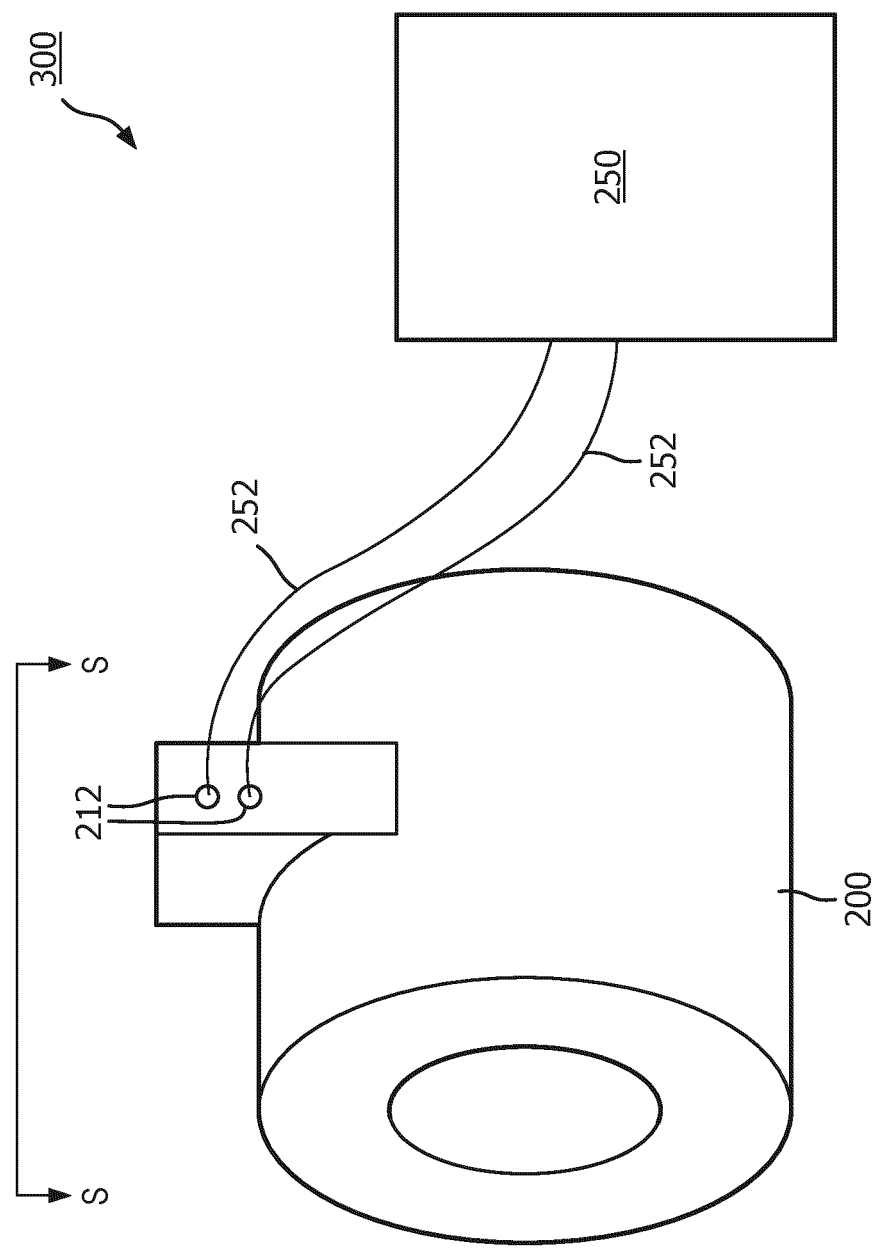
FIG. 4 illustrates an exemplary embodiment of a superconducting magnet system which may be employed in an MRI apparatus in accordance with aspects of the present invention.

Referring to FIG. 4, an exemplary system 300 in accordance with certain disclosed aspects is illustrated, and includes the sealed MRI magnet 200 of FIG. 2 and a cryostation with closed cryogen reservoir 250. The external ports 212, 213 of the cooldown acceleration loop 210 are closed off during normal operation of the magnet 200 to minimize heat input into the cryostat through this system. For cooling down purposes, the external ports 212, 213 are connected to the external cryogenic plant 250 that runs a cryogen through the tubes 252, as illustrated in FIG. 4. Since the cooldown acceleration loop 210 is in contact with the main cooling circuit 204 (see FIG. 2), it can take thermal energy out of it, and return it to the cooldown station, thereby assisting the magnet's coldhead 208 and accelerating cooldown the magnet.

Figure 5:
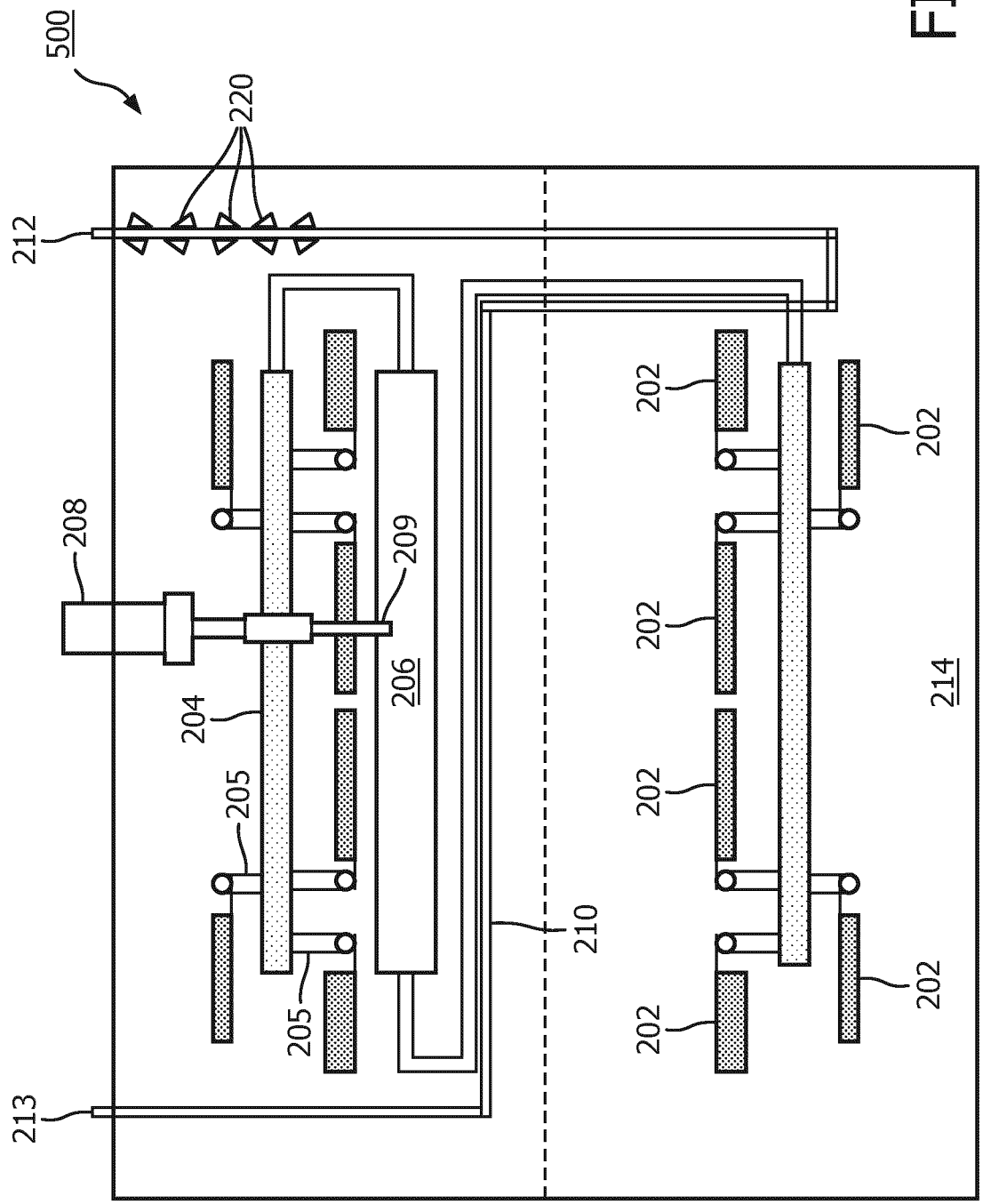
FIG. 5 shows a cross-sectional view of a magnet of the system of FIG. 2.

FIG. 5 illustrates cross-sectional view of a more specific embodiment of a sealed superconducting magnet 500 (which may, for example, correspond to a more detailed embodiment of the sealed superconducting magnet 200 of FIG. 3) shown as a longitudinal sectional view taken along Section S-S indicated in FIG. 4. The magnet 500 includes many components from the embodiment shown in FIG. 2, presented in greater detail in FIG. 5, and these analogous components are labeled with like reference numbers in FIGS. 2 and 5. As shown in FIG. 5, the magnet 500 includes the cryostat (also referred to herein as a vacuum vessel) 214, which is evacuated during normal use, i.e. a vacuum vessel (and hence not filled with liquid helium). One or more superconducting coils 202 (also referred to as magnetic windings 202) are disposed within the cryostat 214. The hermetically (i.e. airtight) sealed cooling system 204 that contains helium (either gas or liquid) is disposed in the vacuum vessel 214. (In other words, the sealed cooling system 204 is initially charged with a helium charge, e.g. to around 1000 psi at atmospheric pressure in some non-limiting illustrative embodiments, and then sealed. The sealed cooling system 204 retains the helium charge in the sealed volume, and the sealed volume remains sealed thereafter during cooldown of the magnet and potentially also remains sealed over the course of repeated maintenance cycles in which the magnet is brought back to room temperature, serviced, and then cooled back down).

The superconducting coils 202 are in thermal contact with the sealed cooling system 204. In the illustrative arrangement, this is by way of tubes 205 of the sealed cooling system 204 (e.g., the lumens of the tubes 205 are part of the helium-containing sealed volume) that carry the helium charge to thermally conductive (e.g. metal) supports or formers around which the superconducting windings 202 are wound. The cooldown acceleration loop 210 includes one or more fluid conduits disposed in the vacuum vessel 214 and in thermal contact with the sealed cooling system 204. The inlet port 212 and the outlet port 213 are disposed at an exterior of the vacuum vessel 214. The cold head 208 is secured to the vacuum vessel 214 and has a highest-stage cold station 209 (e.g., the second stage cold station of a two-stage cold head) that is thermally connected with the heat exchanger 206 which is in thermal contact with the sealed cooling system 204. The operating cold head 208 removes heat from the sealed cooling system 204 and hence from the magnet windings 202 in thermal contact with the sealed cooling system 204.

With continuing reference to FIG. 5, and referring back to FIG. 3, getter material 220 previously described with reference to FIG. 3 is optionally disposed on an exterior of the inlet port 212 (and optionally also on the outlet port 213 although this is not shown in FIG. 5). In addition, the cooldown acceleration loop 210 can include the getter-coated high thermally conducting panels 230 of FIG. 3 (not shown in FIG. 5). The panels 230 can be configured as surface area-enhancing protrusions extending outwardly from an exterior of the inlet 514, outlet 516, or other piping of the cooldown acceleration loop. The getter material 220 can be disposed on these protrusions 230.

In some example embodiments, the magnet 500 exhibits different properties when in use (i.e. cooled down such that the magnet windings 202 are in the superconducting state and carrying a persistent superconducting current) and when not in use (i.e., when the magnet windings 202 are at room temperature). For example, in use, (i) the helium in the hermetically sealed cooling system 204 is at least partially liquefied; (ii) a vacuum inside the vacuum vessel 214 is at a pressure of $10^{-5}$ Torr or lower (which occurs because the cooling system 204 is at a cryogenic temperature, e.g. at or below 4K in some typical non-limiting embodiments, and therefore acts as a cryopump freezing out gasses in the vacuum vessel volume); (iii) the inlet port 212 and the outlet port 213 are sealed; (iv) a vacuum inside the cooldown acceleration loop 210 is at a pressure of 1 milliTorr or lower (and more typically at $10^{-5}$ torr or lower, but may be increase if there is a leak in the vacuum vessel 214); and (v) the vacuum inside the cooldown acceleration loop 210 is not in fluid communication with the vacuum inside the vacuum vessel 214. On the other hand, when the magnet is not in use (e.g., is at a sufficiently high temperature so that the magnet windings 202 are not in the superconducting state), then: (i) the helium in the hermetically sealed cooling system 204 is in the gas state and is at a gauge pressure of at least 100 psig, and more typically around 1000 psig when at room temperature; and (ii) the volume within the cooldown acceleration loop 210 is not in fluid communication with the volume of the vacuum vessel 214.

As shown in FIG. 2, the inlet port 212 and the outlet port 213 are disposed adjacent each other and on one side of the cold head 208. This same arrangement is shown in FIG. 4. FIG. 5 shows an alternative embodiment where the inlet port 212 and the outlet port 213 are disposed on opposing sides of the cold head 208 along the longitudinal direction. Advantageously, this arrangement allows for heat to dissipate from the magnet 500 towards the outlet port 213 and away from the cold head 208, reducing the load on the cold head and allowing the cold head to cool the magnet more quickly.

Figure 6:
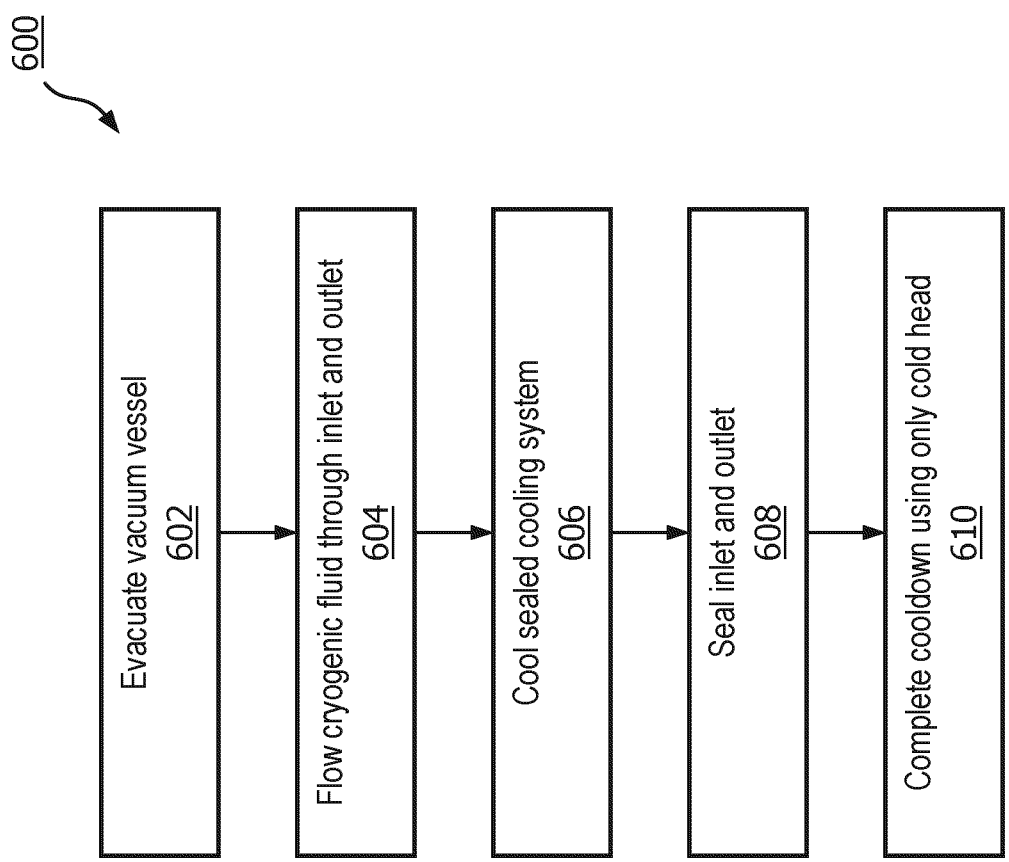
FIG. 6 shows exemplary flow chart operations of the system of FIG. 5.

With reference to FIG. 6, an illustrative embodiment of an instance of a cooldown method 600 for cooling down the magnet 200 or 500 is diagrammatically shown as a flowchart. At 602, the vacuum vessel 214 is evacuated of fluid. At 604, a chilled or cryogenic fluid is flowed through the cooldown acceleration loop 210 via the inlet port 212 and the outlet port 213. At 606, which is performed concurrently with the flowing of the chilled or cryogenic fluid at 604, the sealed cooling system 204 is cooled by operation of the cold head 208. At 608, the inlet port 212 and the outlet port 213 are sealed when the magnet 500 reaches a temperature at which the flow of chilled or cryogenic fluid through the cooldown acceleration loop 210 is no longer operating to accelerate the cooldown process. Depending upon the type of chilled or cryogenic fluid that is used, the step 608 may also include blowing out the cooldown acceleration loop 210 with nitrogen (e.g. if the chilled or cryogenic fluid is gas or liquid helium) and/or actively evacuating the cooldown acceleration loop 210 using a mechanical pump. At 610, the cooldown of the magnet 500 is thereafter completed using only the cold head 208 to achieve a final temperature (e.g., 4K or lower in some non-limiting embodiments), at which the magnet windings 202 are in the superconducting state when carrying the design-basis persistent electrical current.

To perform the cooling operation 606, the cold head 208 is operated to cool the cryogenic fluid disposed inside the sealed cooling system 204. The cooling operation 606 is accelerated by the concurrent operation 604 of flowing chilled or cryogenic fluid through the cooldown acceleration loop 210. The operation 608 at which the cooldown acceleration provided at 604 is terminated can be performed by evacuating the cryogenic fluid from the cooldown acceleration loop 210 when the superconducting magnet 500 falls below a predetermined temperature threshold. This can be performed in a variety of ways. In one example, the cryogenic fluid disposed inside the sealed cooling system 204 is gas helium at 80K. When the cold head 208 is activated, the gas helium is evacuated when the magnet 500 falls below the predetermined temperature threshold (in this case, 80K). The gas helium is evacuated until the magnet reaches another predetermined temperature threshold; for example, 4K.

In another example, the gas helium can be evacuated when the magnet 500 reaches a temperature of approximately 20K. In this case, helium gas at a temperature of approximately 20K is flowed through the cooldown acceleration loop 210 through the inlet port 212 and the outlet port 213 until the magnet 500 reaches a temperature of approximately 4K.

In a further example, the cryogenic fluid is liquid nitrogen at a temperature of approximately 100K. The liquid nitrogen is evacuated when the magnet 500 reaches the point where the acceleration step 604 is no longer providing acceleration of the cooldown (in this case, at some temperature above 100K). The liquid nitrogen is then evacuated as part of operation 608 (e.g., by heating so that the liquid nitrogen evaporates) and cooldown continues at 610 via the cold head 208 alone until the magnet reaches the final desired temperature for superconducting magnet operation.

In yet another example, the chilled or cryogenic fluid includes a combination of gas helium at approximately 80K, liquid nitrogen at a temperature of approximately 100K, and liquid helium. When the magnet 500 falls below a temperature at which the 100K helium gas provides cooldown acceleration, the gas helium is evaluated from the cooldown acceleration loop 210 (as described above), and the liquid nitrogen and liquid helium are heated for evaporation from the cooldown acceleration loop.

The disclosure has been described with reference to the preferred embodiments. Modifications and alterations may occur to others upon reading and understanding the preceding detailed description. It is intended that the exemplary embodiment be construed as including all such modifications and alterations insofar as they come within the scope of the appended claims or the equivalents thereof.

The invention claimed is:

1. A superconducting magnet, comprising:
a vacuum vessel;
one or more superconducting coils disposed within the vacuum vessel;
a hermetically sealed cooling system disposed within the vacuum vessel and containing helium, the superconducting coils being in thermal contact with the hermetically sealed cooling system;
a cooldown acceleration loop comprising one or more fluid conduits disposed within the vacuum vessel and in thermal contact with hermetically sealed cooling system and further comprising inlet and outlet ports at an exterior of the vacuum vessel and
a cold head secured at least partially within a vacuum vessel and having its highest-stage cold station thermally connected with the hermetically sealed cooling system,
wherein the helium in the hermetically sealed cooling system is at least partially liquefied;
a vacuum inside the vacuum vessel is at a pressure of $10^{-5}$ Torr or lower;
the inlet and outlet ports of the cooldown acceleration loop are sealed;
a vacuum inside the one or more fluid conduits of the cooldown acceleration loop is at a pressure of 1 milliTorr or lower, and
the vacuum inside the one or more fluid conduits is not in fluid communication with the vacuum inside the vacuum vessel.

2. The apparatus of claim 1, further including an external cryogenic plant coupled to the one or more ports through cryogenic tubes.

3. The apparatus of claim 2, wherein the external cryogenic plant is a closed cryogen reservoir.

4. The apparatus of claim 1, wherein the sealed cooling system and the second cooling system do not share cryogenics.

5. The superconducting magnet of claim 1, wherein:
the helium in the hermetically sealed cooling system is not liquefied and is at a gauge pressure of at least 100 psig, and
the volume within the one or more fluid conduits of the cooldown acceleration loop is not in fluid communication with the volume of the vacuum vessel.

6. The superconducting magnet of claim 1, further comprising:
getter material disposed on an exterior of at least an inlet fluid conduit of the one or more fluid conduits of the cooldown acceleration loop;
wherein the inlet fluid conduit is connected with the inlet port of the cooldown acceleration loop.

7. The superconducting magnet of claim 6, wherein the cooldown acceleration loop further includes:
surface area-enhancing protrusions extending outwardly from an exterior of the one or more fluid conduits of the cooldown acceleration loop, the getter material being disposed on the surface area-enhancing protrusions of the cooldown acceleration loop.

8. The superconducting magnet of claim 1, further comprising:
getter material disposed on an exterior of the one or more fluid conduits of the cooldown acceleration loop.

9. The superconducting magnet of claim 1, wherein the hermetically sealed cooling system defines a bore around which the one or more superconducting coils are wrapped.

10. A magnetic resonance imaging system, comprising:
a superconducting magnet as set forth in claim 6, wherein the superconducting magnet defines a bore around which the one or more superconducting coils are wrapped; and
resistive magnetic field gradient coils disposed outside the bore.

11. A cooldown method for cooling down a superconducting magnet comprising magnet windings disposed in a vacuum vessel, a hermetically sealed cooling system disposed in the vacuum vessel in thermal communication with the magnet windings, and a cooldown acceleration loop in thermal communication with the hermetically sealed cooling system, the cooldown method comprising:
evacuating the vacuum vessel;
flowing a cryogenic fluid through the cooldown acceleration loop via inlet and outlet ports of the cooldown acceleration loop; and
concurrently with the flowing of the cryogenic fluid, cooling the hermetically sealed cooling system,
wherein the cooling of the hermetically sealed cooling system includes operating a cold head to cool the cryogenic disposed inside the hermetically sealed cooling system,
wherein when the cold head is activated, evacuating the cryogenic fluid from the cooldown acceleration loop when the superconducting magnet falls below a predetermined temperature threshold,
wherein the predetermined temperature threshold is approximately 80K and the cryogenic fluid is gas helium at a temperature of approximately 80K;
evacuating the cryogenic fluid until the superconducting magnet reaches a temperature of approximately 20K; and
flowing helium gas at a temperature of approximately 20K through the cooldown loop via the inlet and outlet ports of the cooldown acceleration loop until the superconducting magnet reaches a temperature of approximately 4K.

12. The cooldown method of claim 11, further including:
sealing the inlet and outlet ports when the superconducting magnet reaches a final temperature threshold.

13. A cooldown method for cooling down a superconducting magnet comprising magnet windings disposed in a vacuum vessel, a hermetically sealed cooling system disposed in the vacuum vessel in thermal communication with the magnet windings, and a cooldown acceleration loop in thermal communication with the hermetically sealed cooling system;
evacuating the vacuum vessel;
flowing a cryogenic fluid through the cooldown acceleration loop via inlet and outlet ports of the cooldown acceleration loop; and
concurrently with the flowing of the cryogenic fluid, cooling the hermetically sealed cooling system,
wherein the cooling of the hermetically sealed cooling system includes operating a cold head to cool the cryogenic disposed inside the hermetically sealed cooling system,
wherein when the cold head is activated, evacuating the cryogenic fluid from the cooldown acceleration loop when the superconducting magnet falls below a predetermined temperature threshold,
wherein the predetermined temperature threshold is approximately 100K and the cryogenic fluid is liquid nitrogen at a temperature of approximately 100K, and the method further includes:
evacuating the cryogenic fluid until the superconducting magnet reaches a temperature of approximately 77K.

14. The cooldown method of claim 13, further including:
heating the liquid nitrogen for evaporation until the superconducting magnet reaches a temperature of approximately 10K.

15. The cooldown method of claim 13, further including:
sealing the inlet and outlet ports when the superconducting magnet reaches a final temperature threshold.

16. A cooldown method for cooling down a superconducting magnet comprising magnet windings disposed in a vacuum vessel, a hermetically sealed cooling system disposed in the vacuum vessel in thermal communication with the magnet windings, and a cooldown acceleration loop in thermal communication with the hermetically sealed cooling system;
    evacuating the vacuum vessel;
    flowing a cryogenic fluid through the cooldown acceleration loop via inlet and outlet ports of the cooldown acceleration loop; and
    concurrently with the flowing of the cryogenic fluid, cooling the hermetically sealed cooling system,
    wherein the cooling of the hermetically sealed cooling system includes operating a cold head to cool the cryogenic disposed inside the hermetically sealed cooling system,
    wherein when the cold head is activated, evacuating the cryogenic fluid from the cooldown acceleration loop when the superconducting magnet falls below a predetermined temperature threshold,
    wherein the cryogenic fluid includes gas helium at approximately 80K, liquid nitrogen at a temperature of approximately 100K, and liquid helium, and, when the superconducting magnet reaches a temperature of approximately 100K, the method further includes:
evacuating the gas helium from the cooldown acceleration loop;
heating the liquid nitrogen and the liquid helium for evaporation from the cooldown acceleration loop.

17. The cooldown method of claim 16, further including:
sealing the inlet and outlet ports when the superconducting magnet reaches a final temperature threshold.

* * * * *